(12) United States Patent
Iwase et al.

(10) Patent No.: US 8,540,837 B2
(45) Date of Patent: Sep. 24, 2013

(54) FUNCTIONAL FILM AND METHOD FOR MANUFACTURING THE FUNCTIONAL FILM

(75) Inventors: Eijirou Iwase, Kanagawa (JP); Jun Fujinawa, Kanagawa (JP); Toyoaki Hieda, Kanagawa (JP); Toshiyuki Katagiri, Kanagawa (JP); Hiroshi Arakatsu, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 7 days.

(21) Appl. No.: 12/712,981

(22) Filed: Feb. 25, 2010

(65) Prior Publication Data

US 2010/0215986 A1     Aug. 26, 2010

(30) Foreign Application Priority Data

Feb. 26, 2009  (JP) ................. 2009-044574

(51) Int. Cl.
  *B32B 38/10*  (2006.01)
  *B32B 27/00*  (2006.01)
(52) U.S. Cl.
  USPC ......... 156/247; 156/150; 427/251; 427/255.5
(58) Field of Classification Search
  USPC ....... 427/509, 251, 255.5; 118/718; 156/150
  See application file for complete search history.

(56) References Cited

U.S. PATENT DOCUMENTS

| | | | |
|---|---|---|---|
| 2,367,660 A | 1/1945 | Agre | |
| 2,448,828 A | 9/1948 | Renfrew | |
| 2,681,294 A | 6/1954 | Beguin | |
| 2,722,512 A | 11/1955 | Crandall | |
| 2,951,758 A | 9/1960 | Notley | |
| 3,046,127 A | 7/1962 | Barney et al. | |
| 3,549,367 A | 12/1970 | Chang et al. | |
| 4,038,257 A | 7/1977 | Suzuki et al. | |
| 4,212,976 A | 7/1980 | Shen et al. | |
| 4,239,850 A | 12/1980 | Kita et al. | |
| 5,589,007 A * | 12/1996 | Fujioka et al. | 136/249 |
| 5,725,909 A * | 3/1998 | Shaw et al. | 427/412.1 |
| 6,602,347 B1 * | 8/2003 | Shimoda et al. | 118/718 |
| 2001/0055647 A1 * | 12/2001 | Tamura et al. | 427/177 |

(Continued)

FOREIGN PATENT DOCUMENTS

| JP | 48-64183 | 9/1973 |
|---|---|---|
| JP | 48-41708 | 12/1973 |

(Continued)

OTHER PUBLICATIONS

EP Communications, dated Jun. 10, 2010, issued in corresponding EP Application No. 10154815.4, 7 pages.

(Continued)

*Primary Examiner* — William Bell
(74) *Attorney, Agent, or Firm* — Sughrue Mion, PLLC

(57) ABSTRACT

A method for manufacturing a functional film includes steps of: feeding a support continuously from a first film roll, forming a coating film on the support, providing a laminate film on a surface of the coating film, and taking up the support to a second film roll; and loading the second film roll made by the aforementioned step in a vacuum film-forming apparatus, feeding the support provided with the laminate film continuously from the film roll, peeling off the laminate film, forming an inorganic film on the coating film on the support, and taking up the support to a third film roll.

7 Claims, 3 Drawing Sheets

(56) References Cited

U.S. PATENT DOCUMENTS

| | | |
|---|---|---|
| 2002/0018883 A1 | 2/2002 | Okazaki et al. |
| 2002/0176169 A1 | 11/2002 | Shoshi et al. |
| 2005/0079380 A1* | 4/2005 | Iwanaga .................. 428/688 |
| 2006/0273219 A1* | 12/2006 | McCollough et al. ........ 242/899 |
| 2009/0233108 A1 | 9/2009 | Tsukamoto |
| 2010/0215986 A1 | 8/2010 | Iwase et al. |
| 2010/0247810 A1 | 9/2010 | Yukinobu et al. |
| 2011/0091742 A1 | 4/2011 | Iwase et al. |

FOREIGN PATENT DOCUMENTS

| | | |
|---|---|---|
| JP | 49-43191 | 11/1974 |
| JP | 50-6034 | 3/1975 |
| JP | 51-37193 | 3/1976 |
| JP | 51-48516 | 12/1976 |
| JP | 52-30490 | 8/1977 |
| JP | 6-060374 A | 3/1994 |
| JP | 06228752 A | 8/1994 |
| JP | 8-092727 A | 4/1996 |
| JP | 11-33600 A | 5/1999 |
| JP | 11-133600 A | 5/1999 |
| JP | 2000127328 A | 5/2000 |
| JP | 2002-264274 | 9/2002 |
| JP | 2002286908 A | 10/2002 |
| JP | 2003118046 A | 4/2003 |
| JP | 2003205569 A | 7/2003 |
| JP | 2003276037 A | 9/2003 |
| JP | 2006036904 A | 2/2006 |
| JP | 2006043965 A | 2/2006 |
| JP | 2007261052 A | 10/2007 |
| JP | 2009221541 A | 10/2009 |
| JP | 2010222702 A | 10/2010 |
| JP | 2010234340 A | 10/2010 |
| WO | WO 0077118 A1 * | 12/2000 |
| WO | 2007138837 A1 | 12/2007 |
| WO | 2009057637 A1 | 5/2009 |
| WO | 2010024149 A1 | 3/2010 |

OTHER PUBLICATIONS

Harris, "Review of Organic Light Emitting Diode Fabrication and Recent Progress," Soft Electronics Final Paper, May 4, 2008, pp. 1-6, XP-002583090.

Charton et al., "Development of high barrier films on flexible polymer substrates," Thin Solid Films, vol. 502, No. 1-2, Aug. 15, 2005, pp. 99-103, XP-025006223.

The First Office Action, dated Dec. 31, 2012, issued in corresponding CN Application No. 201010126475.7, 13 pages in English and Chinese.

Notification of Reasons for Rejection, dated Jul. 1, 2013, issued in JP Application No. 2009-238398, 10 pages in English and Japanese.

Notification of Reasons for Rejection, dated Jul. 1, 2013, issued in related JP Application No. 2010-042509, 9 pages in English and Japanese.

English translation of Claims 1 and 6-8 of JP Application No. 2009-087842/JP Publication No. 2010/234340, 1 page.

Polymer Dictionary, New Edition, compiled by The Society of Polymer Science, Asakura Publication Co, Ltd. Mar. 20, 2001, First Edition, Sixth Printing, pp. 384-385, 3 pages, Japanese only.

* cited by examiner

FUNCTIONAL FILM AND METHOD FOR MANUFACTURING THE FUNCTIONAL FILM

BACKGROUND OF THE INVENTION

1. Field of the Invention

The presently disclosed subject matter relates to a functional film and a method for manufacturing the functional film, and especially to a functional film and a method for manufacturing the functional film, the film including a laminated structure obtained by feeding a film from a film roll manufactured by taking up a coating film formed, and forming on the coating film an inorganic film.

2. Description of the Related Art

In various devices such as an optical element, a display device such as a liquid crystal display and an organic EL (electroluminescence) display, a semiconductor device, and a thin-film photovoltaic cell, there are used functional films such as a gas barrier film, a protective film, an optical filter, and an antireflection film.

Further, for manufacturing these functional films, there is used a film-forming technology based on a vacuum film-forming method such as sputtering, and plasma CVD (chemical vapor deposition). In order to form a film by a vacuum film-forming method efficiently and with high productivity, it is also practiced to form a film continuously on a long substrate.

A method for manufacturing the functional film will be described. While feeding a long support continuously from a film roll, a coating liquid is applied on the support, dried, and cured to form a coating film. The support, on which the coating film is formed, is taken up to manufacture a film roll. Then, the film roll having the coating film formed thereon is set in a feeding section of a vacuum film-forming apparatus, and the support is continuously fed from the film roll to a film-forming chamber. In the film-forming chamber, an inorganic film is formed on the coating film, and the film, on which a laminated structure including the coating film and the inorganic film is formed, is taken up to manufacture a film roll. As an apparatus to carry out this film-forming method, there is known a so-called roll-to-roll film-forming apparatus. By carrying out the film-forming step for the coating film and the inorganic film a plurality of times using this film-forming apparatus, a functional film having a plurality of laminated structures is manufactured.

In the above-described manufacturing method, in order to make the quality of the functional film uniform by preventing misaligned winding when forming an inorganic film, in Japanese Patent Application Laid-Open No. H8-92727, there is described a method whereby a film roll having a winding hardness of 70 to 95 is set in the feeding section of the vacuum film-forming apparatus, and an inorganic film is continuously formed on the support.

Furthermore, in Japanese Patent Application Laid-Open No. H6-60374, there is described that a winding body of a long plastic film is inserted in a vapor deposition chamber, and then the vapor deposition chamber is depressurized to 20 Torr for 2 minutes or longer. Then, the chamber being evacuated to the usual vapor deposition pressure, and then a ferromagnetic alloy or an alloy is adhered on the plastic film by a vapor deposition method.

SUMMARY OF THE INVENTION

However, even if a film roll having a coating film formed thereon were taken up with winding hardness of 70 to 95 as described in Japanese Patent Application Laid-Open No. H8-92727, the film roll brings in air entrained when the support is taken up. When the film roll carrying entrained air is set in a depressurized feeding section of the vacuum film-forming apparatus, the entrained air in the film roll escapes. This breaks a balance of stress (tensional force, frictional force) inside the film roll acquired during take-up, and "tight winding (roll diameter shrinkage)" occurs in the film roll.

If this "tight winding" occurs in the film roll, the coating film on the support scrapes against the rear surface of the support on upper side and also comes in contact with dirt which stuck to the rear surface of the support, resulting in the occurrence of minute film ruptures and loss of smoothness of the coating film. After this, when the support is conveyed and an inorganic film is formed on the coating film, defects in film formation arise and cause a problem of cracks/deficiencies of the inorganic film.

The method disclosed in Japanese Patent Application Laid-Open No. H6-60374 aims to suppress misaligned winding of a film roll in the width direction by evacuating air and reducing the pressure to 20 Torr for at least 2 minutes. However, it has become clear that, under this condition, the misaligned winding due to the tight winding (shrinkage) in the radial direction cannot be suppressed completely.

Furthermore, in Japanese Patent Application Laid-Open No. H6-60374, pressure in the vapor deposition chamber is reduced after the film roll is set therein, thus it is necessary to reduce the pressure of the whole inside of the vapor deposition chamber to a pressure required for vapor deposition. Therefore, if much time is spent for pressure reduction in order to prevent the misaligned winding, the total pressure reduction time before film-forming becomes long, resulting decrease in productivity. Especially, in a case of a vapor deposition apparatus which corresponds to a large-size film roll, the volume inside the vacuum deposition chamber becomes large and, therefore, the total pressure reduction time becomes very long, causing significant decrease in productivity.

The presently disclosed subject matter has been made under these circumstances and provides a functional film and a method for manufacturing the functional film, which can suppress occurrence of defects of the inorganic film such as cracks and deficiencies, when forming the inorganic film on the coating film by a vacuum film-forming method, and which, further, are of high productivity.

In order to attain the above-mentioned object, the method of the presently disclosed subject matter for manufacturing a functional film includes steps of: feeding a support continuously from a first film roll, forming a coating film on the support, providing a laminate film on a surface of the coating film, and taking up the support to a second film roll; and loading the second film roll made by the aforementioned step in a vacuum film-forming apparatus, feeding the support provided with the laminate film continuously from the second film roll, peeling off the laminate film, forming an inorganic film on the coating film on the support, and taking up the support to a third film roll.

According to the presently disclosed subject matter, after the coating film is applied, dried, and cured, the support is taken up as the second film roll with a laminate film inserted on the surface of the coating film layer. And, the second film roll is set in the vacuum film-forming apparatus, and the laminate film is peeled off before formation of an inorganic film. Thus, the coating film layer is not damaged by tight winding when vacuum-evacuated. And, since the coating film layer is conveyed to the vacuum film-forming apparatus while being protected, formation of an inorganic film becomes possible without the coating film layer being damaged during the course of handling.

Therefore, according to the presently disclosed subject matter, the occurrence of defects of the inorganic film such as cracks and deficiencies can be suppressed and, further, a method with high productivity for manufacturing a functional film can be provided.

In the method of the presently disclosed subject matter for manufacturing a functional film, the laminate film is preferably provided after curing of the coating film and before a pass roller coming in contact with the coating film side of the support.

Furthermore, in the method of the presently disclosed subject matter for manufacturing a functional film, the laminate film is preferably peeled off before formation of the inorganic film and after the support has passed through all the pass rollers which come in contact with the coating film side of the support.

As described above, by preventing the pass roller from coming in contact with the coating film side of the support, the occurrence of defects of the inorganic film such as cracks and deficiencies can further be suppressed.

In the method of the presently disclosed subject matter for manufacturing a functional film, the thickness of the laminate film is preferably 10 μm or more and 300 μm or less.

Further, in the method of the presently disclosed subject matter for manufacturing a functional film, the thickness of the inorganic film is preferably 10 nm or more and at most 200 nm or less.

Furthermore, in the method of the presently disclosed subject matter for manufacturing a functional film, there is preferably applied on the laminate film an adhesive material which exhibits a peel force of 1 N/m or more and 5 N/m or less against the coating film.

According to the method of the presently disclosed subject matter for manufacturing a functional film, the moisture permeability of the functional film can be made less than $1.0 \times 10^{-3}$ g/m$^2$·day.

Additionally, in the method of the presently disclosed subject matter for manufacturing a functional film, the coating film is preferably formed from a material containing a radiation-curable monomer or oligomer.

The presently disclosed subject matter is particularly effective when the coating film is formed from a material comprising a radiation-curable monomer or oligomer.

In order to attain the aforementioned object, the functional film of the presently disclosed subject matter is a functional film which is manufactured according to the aforementioned manufacturing method.

The functional film manufactured according to the manufacturing method of the presently disclosed subject matter can, because defects of the inorganic film such as cracks/deficiencies are suppressed therein, be used suitably as various functional films for an optical element, a display device, a semiconductor device, and a thin-film photovoltaic cell, and the like.

According to the presently disclosed subject matter, the occurrence of defects of the inorganic film such as cracks and deficiencies of the inorganic film can be suppressed when the inorganic film is formed on a coating film by a vacuum film-forming method and, further, a functional film and a method for manufacturing the functional film with high productivity can be provided.

DETAILED DESCRIPTION OF THE PREFERRED EMBODIMENTS

Hereinafter, preferable embodiments of the presently disclosed subject matter will be described with reference to the accompanying drawings. The presently disclosed subject matter will be described by the following preferable embodiments but modifications can be made by many techniques without deviating from the scope of the presently disclosed subject matter, and embodiments other than the embodiments described below may be utilized. Accordingly, all modifications in the scope of the presently disclosed subject matter are included in the scope of the claims. Also, a numerical range represented by using the notation "to", means a range including the numbers described before and after "to".

Hereinafter, the method of the presently disclosed subject matter for manufacturing a functional film will be described.

Figure 1:
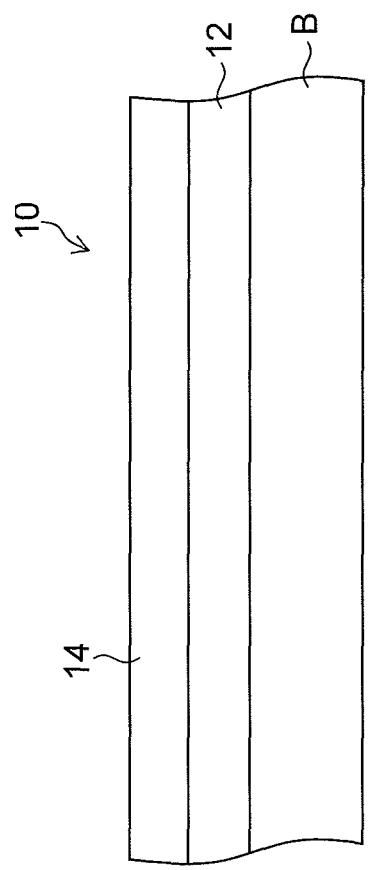
FIG. 1 is a sectional view illustrating a functional film manufactured by a method for manufacturing a functional film according to an embodiment of the presently disclosed subject matter.

FIG. 1 shows a schematic diagram of a functional film manufactured by the method for manufacturing a functional film according to the embodiment of the presently disclosed subject matter.

As illustrated in FIG. 1, the method for manufacturing a functional film is a method for manufacturing a laminated body (hereinafter may also be referred to as a functional film, a laminate film, or an optical film) 10 by forming a prescribed coating film 12 on a surface of a support "B" (original film) and forming on this coating film 12 an inorganic film 14 by a vacuum film-forming method.

The method for manufacturing a functional film is, for example, a method for manufacturing the laminate film 10 by a coating film-forming apparatus 20 for forming the coating film 12 on the surface of the support B and an inorganic film-forming apparatus 22 for forming the inorganic film 14 on (the surface of) the coating film 12.

Figure 2A:
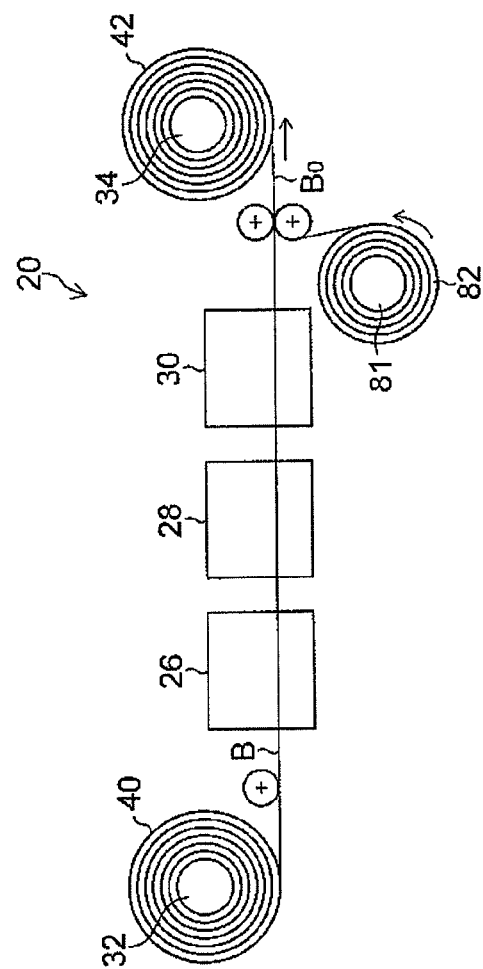
FIGS. 2A and 2B are diagrams each illustrating an example of an apparatus for carrying out the method for manufacturing a functional film according to the embodiment of the presently disclosed subject matter.

FIG. 2A conceptually shows an example of the coating film-forming apparatus 20 for carrying out the method for manufacturing a functional film.

The coating film-forming apparatus 20 includes a coating device 26, a heating device 28, and a UV (ultraviolet) irradiation instrument 30. By the coating film-forming apparatus 20, the coating film 12 is formed by applying a coating liquid, prepared beforehand and containing a radiation-curable monomer or oligomer, on the support B by means of the coating device 26, drying by means of the heating device 28, and polymerizing the monomer or the oligomer by mean of the UV irradiation instrument 30.

This coating film-forming apparatus 20 forms a coating film by a roll-to-roll method. The support B is loaded on a rotating shaft 32 as a base material roll 40. While the support B is conveyed in the longitudinal direction, a coating film is formed on the support B. A support "Bo" on which the coating film is formed is taken up as a roll 42 by a take-up shaft 34.

The support B fed from the base material roll 40 is first conveyed to the coating device 26. The coating device 26 applies on the surface of the support B a coating liquid containing a radiation-curable monomer or oligomer, the coating liquid prepared beforehand and will become the coating film 12. All of the usual liquid coating methods can be utilized as a method for applying the costing liquid.

The support B is then conveyed to the heating device 28. In the heating device 28, a solvent contained in the coating liquid applied by the coating device 26 is dried. The method for heating the coating liquid is not particularly limited. Publicly known heating methods such as heating by a heater and heating by warm wind are all utilizable as long as they can heat and dry the coating liquid according to the conveying speed of the support B and the like, before the support reaches the UV irradiation instrument 30.

The support B is then conveyed to the UV irradiation instrument 30. The UV irradiation instrument 30 forms the coating film 12 through polymerization of the radiation-curable monomer or oligomer by irradiating UV (ultraviolet light) on the coating liquid applied by the coating device 26 and heated to dryness by the heating device 28.

Then, in the presently disclosed subject matter, a laminate film 82 is wound off from a laminate film unwinder 81 and the laminate film 82 is wound on the support (film) Bo and taken up by the take-up shaft 34.

Figure 2B:
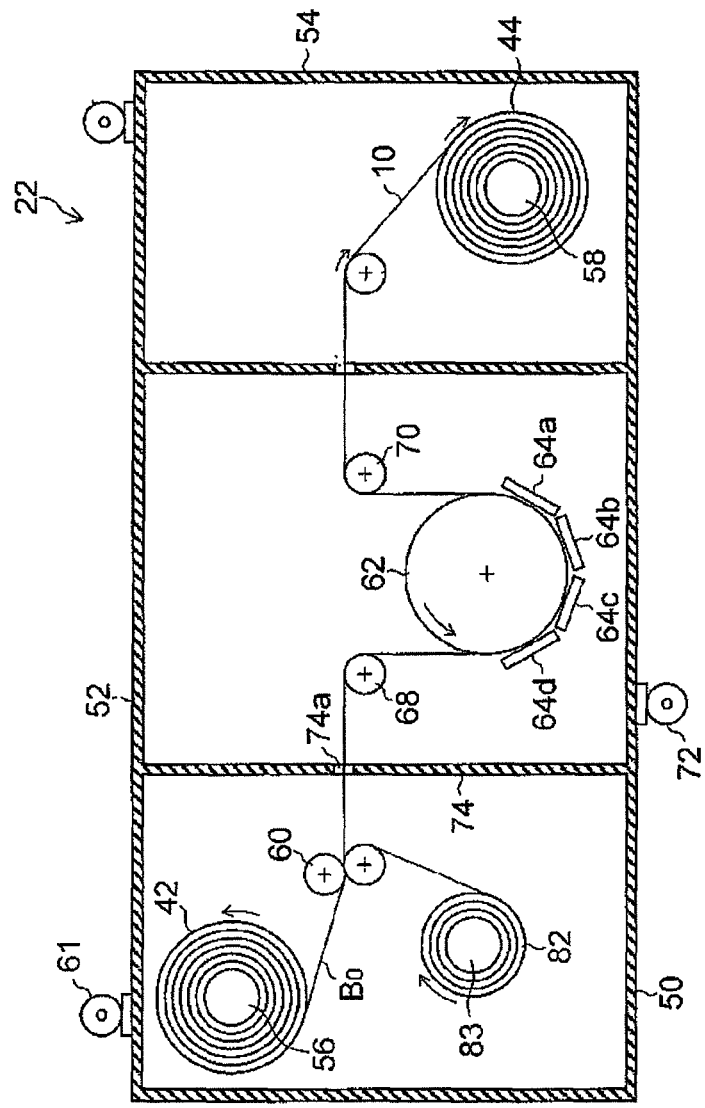

Subsequently, a base material roll 42 obtained by winding the support Bo on which the coating film 12 is formed is loaded in the inorganic film-forming apparatus 22, which is conceptually shown in FIG. 2B.

The inorganic film-forming apparatus 22 forms the inorganic film 14 by a vacuum film-forming method on the surface of the support Bo (namely on the surface of the coating film 12). The inorganic film-forming apparatus 22 includes a feeding chamber 50, a film-forming chamber 52, and a take-up chamber 54.

The inorganic film-forming apparatus 22 carries out a film formation in a roll-to-roll method as is the case with the coating film-forming apparatus 20. In the inorganic film-forming apparatus 22, the support Bo is fed from the base material roll 42. While the support Bo is conveyed in the longitudinal direction, the inorganic film 14 is formed on the support Bo. Then, the functional film 10 on which the coating film 12 and the inorganic film 14 are formed is taken up in a roll shape by a take-up shaft 58 to make a film roll 44.

The feeding chamber 50 includes a rotating shaft 56, a guide roller (pass roller) 60, and a vacuum evacuation device 61. In addition, the feeding chamber 50 includes a laminate film take-up device 83 for taking up the laminate film 82 wound around the support Bo of the base material roll 42 by the coating film-forming apparatus 20.

In the inorganic film-forming apparatus 22, the base material roll 42, where the support Bo having the coating film 12 formed on the support B and the laminate film 82 are wound, is loaded on the rotating shaft 56 in the feeding chamber 50. When the base material roll 42 is loaded on the rotating shaft 56, the support Bo is passed (conveyed) through a predetermined conveying path from the feeding chamber 50, through the film-forming chamber 52, to the take-up shaft 58 in the take-up chamber 54. In the inorganic film-forming apparatus 22, also, feeding of the support Bo from the base material roll 42 and take-up of the functional film 10 on the take-up shaft 58 are carried out synchronously, and the inorganic film 14 is formed on the support Bo continuously while the long support Bo is conveyed in the longitudinal direction along the predetermined conveying path.

In the feeding chamber 50, the support Bo is fed from the base material roll 42 by rotating the rotating shaft 56 counterclockwise in the figure by means of a drive source (not illustrated). Then, the support Bo is guided along a prescribed path by the guide roller (pass roller) 60, and is conveyed to the film-forming chamber 52.

Further, the vacuum evacuation device 61 is disposed in the feeding chamber 50. The vacuum evacuation device 61 depressurizes the inside of the feeding chamber 50 to a prescribed degree of vacuum (pressure) corresponding to a film-forming pressure in the film-forming chamber 52. This prevents the pressure in the feeding chamber 50 from negatively affecting the pressure or a film formation in the film-forming chamber 52. In addition, as the vacuum evacuation device 61, there may be used a publicly known one as is the case with an after-mentioned vacuum evacuation device 72 in the film-forming chamber 52.

Furthermore, in the feeding chamber 50, there may be disposed, in addition to the members shown in the figure, various members (conveying devices) for conveying the support Bo along the prescribed path, such as a pair of conveying rollers and a guide member for controlling the position of the support Bo in the width direction.

The support Bo is guided by the guide roller 60 and conveyed into the film-forming chamber 52.

In the film-forming chamber 52, the inorganic film 14 is formed on the surface of the support Bo (namely, on the surface of the coating film 12) by a vacuum film-forming method. In the illustrated example, the film-forming chamber 52 includes a drum 62, film-forming devices 64a, 64b, 64c, and 64d, guide rollers 68 and 70, and the vacuum evacuation device 72. In addition, when the film-forming chamber 52 is one for film-formation by means of sputtering, plasma CVD, and the like, there is further installed, in the film-forming chamber 52, a high-frequency power source and the like.

The support Bo is conveyed into the film-forming chamber 52 through a slit 74a formed on a partition wall 74 which divides the feeding chamber 50 and the film-forming chamber 52.

The diagrammatically exemplified inorganic film-forming apparatus 22 can preferably include vacuum evacuation devices installed also in the feeding chamber 50 and the take-up chamber 54. In this case, depending on the film-forming pressure in the film-forming chamber 52, the feeding chamber 50 and the take-up chamber 54 are also brought to a vacuum. However, the apparatus whereby the presently disclosed subject matter is carried out is not limited to this. For example, while vacuum evacuation devices may not be installed in the feeding chamber 50 and the take-up chamber 54. In this case, by adjusting the size of a slit, through which the support Bo passes, to the least possible size for the support Bo to pass through without the support Bo touching the partition wall 74, the film-forming chamber 52 may be substantially constituted air sealing. Alternatively, without installing vacuum evacuation devices in the feeding chamber 50 and the take-up chamber 54, subchambers through which the support Bo passes may be installed between the feeding chamber 50 and the film-forming chamber 52, and between the take-up chamber 54 and the film-forming chamber 52. Inside of these subchambers may be vacuumized by a vacuum pump.

In addition, when a subchamber and the like are installed upstream of the film-forming chamber 52 (upstream of the conveying direction of the support Bo), in a case the device for conveying the base material inside this subchamber and the like also touches the coating film 12, the device may be constituted in such a way that the device touches only the ends of the support Bo.

The drum 62 in the film-forming chamber 52 is a cylindrical member which rotates counterclockwise in the figure with the central axis as the center.

The support Bo, fed from the feeding chamber 50 and guided to a predetermined path by the guide roller (pass roller) 68, is wound around the drum 62. And, the support Bo, while being supported and guided by the drum 62, is conveyed along the predetermined conveying path. The inorganic film 14 is formed on the surface (on the coating film 12) by means of the film-forming devices 64a to 64d and the like. Further, when the film-forming chamber 52 is one whereby film formation is carried out by sputtering, plasma CVD, and the like, the drum 62 may be grounded (earthed), or may be connected to a high-frequency power source so that the drum 62 functions as an opposite electrode.

The film-forming devices 64a to 64d forms the inorganic film 14 on the surface of the support B by a vacuum film-forming method.

Here, in the manufacturing method of the presently disclosed subject matter, there is no particular limitation to the method for forming the inorganic film 14.

Publicly known vacuum film-forming methods (vapor-phase deposition methods) are all applicable, including CVD, plasma CVD, sputtering, vacuum deposition, ion plating, and the like.

Therefore, the film-forming devices 64a to 64d can include various members, corresponding to a vacuum film-forming method to be carried out.

For example, when the film-forming chamber 52 is one where formation of the inorganic film 14 is conducted by an ICP-CVD method (inductively-coupled plasma CVD), each of the film-forming devices 64a to 64d may include a induction coil to form an induced magnetic field, and a gas supply device to supply a reactive gas to the film-forming area.

When the film-forming chamber 52 is one where formation of the inorganic film 14 is carried out by a CCP-CVD method (capacitively-coupled plasma CVD), each of the film-forming devices 64a to 64d may include a shower electrode which functions as high-frequency electrodes and reactive gas supply devices. The shower electrode may be hollow, connected to a source of a reactive gas, and have many small openings on the surface thereof, the surface facing the drum 62.

When the film-forming chamber 52 is one where formation of the inorganic film 14 is conducted by a CVD method, each of the film-forming devices 64a to 64d may include reactive gas introducing devices.

Further, when the film-forming chamber 52 is one where formation of the inorganic film 14 is conducted by sputtering, each of the film-forming devices 64a to 64d may include a target holding device, a high-frequency electrode, a sputtering gas supply device.

The vacuum evacuation device 72 vacuum-evacuates the inside of the film-forming chamber 52 and brings the chamber to a degree of vacuum corresponding to formation of the inorganic film 14 by a vacuum film-forming method.

There is no limitation, also, on the vacuum evacuation device 72. Vacuum pumps such as a turbopump, a mechanical booster pump, and a rotary pump are utilizable. Additionally, there are applicable various publicly known (vacuum) evacuation devices used in a vacuum film-forming apparatus, which utilize an auxiliary device such as a cryocoil, and a control device for the degree of vacuum which can be achieved, air volume displacement, and the like.

The support Bo, namely the laminate film (the functional film) 10, on which the inorganic film 14 is formed by the film-forming devices 64a to 64d while being supported and conveyed by the drum 62, is guided to a predetermined path by the guide roller 70, conveyed into the take-up chamber 54, and taken up in a roll shape by the take-up shaft 58. The laminate film (functional film) roll taken up in a roll shape is supplied to the next step.

As described above, the method for manufacturing the functional film according to the presently disclosed subject matter includes a step for feeding the support B continuously from the film roll 40, forming the coating film 12 on the support B to make the support Bo, providing the laminate film 82 on the surface of the coating film 12, and taking up the support as the film roll 42; and a step for loading the film roll 42 taken up in the aforementioned step in the vacuum film-forming apparatus 22, feeding the support Bo provided with the laminate film 82 continuously from the film roll 42, peeling off the laminate film 82 from the support Bo, forming the inorganic film 14 on the coating film 12 on the support B, and taking up the support Bo as a film roll.

In conventional production of the functional film, there have been possibilities such as the occurrence of minute film ruptures and loss of smoothness of the coating film 12 in the film roll 42, since the coating film 12 on the support B scrapes against the upper rear surface of the support B and also comes in contact with dirt which stuck to the rear surface of the support B. Further, when the inorganic film 14 is formed on this coating film 12, there has been a possibility that defects in film formation arise and cracks/deficiencies of the inorganic film occur.

According to the presently disclosed subject matter, after the coating film 12 is applied, dried, and cured (hardening-processed), the support Bo is taken up into a film roll 42 with the laminate film 82 being inserted on the surface of the coating film layer. This film roll 42 is set in the vacuum film-forming apparatus 22, and the laminate film 82 is peeled off before formation of the inorganic film 14. Thus, formation of an inorganic film 14 becomes possible without the coating film layer being damaged by tight winding at the time of vacuum evacuation and without the coating film layer being damaged during the course of handling since the support Bo is conveyed to the vacuum film-forming apparatus 22 with the coating film layer protected.

Therefore, according to the presently disclosed subject matter, the occurrence of defects of the inorganic film 14 such as cracks and deficiencies can be suppressed and a method with high productivity for manufacturing a functional film can be provided.

In the method of the presently disclosed subject matter for manufacturing a functional film, the laminate film 82 is preferably peeled off before formation of the inorganic film 14 and after the support Bo has passed through all the pass rollers which come into contact with the surface of the coating film side of the support Bo. Namely, in FIG. 2B, the laminate film 82 is preferably peeled off after the support Bo has passed the pass roller 68.

Also, similarly, in the method of the presently disclosed subject matter for manufacturing a functional film, the laminate film is preferably provided after curing of the coating film 12 and before a pass roller coming in contact with the coating film side of the support Bo.

In addition, the thickness of the laminate film 82 is preferably greater than or equal to 10 μm and less than or equal to 300 μm.

Further, on the laminate film 82, there is preferably applied an adhesive material having a peel force of 1 N/m or greater and 5 N/m or less against the coating film 12. This is because, when left under vacuum, air between the coating film layer and the laminate film 82 escapes, and adhesion force between them is improved naturally. Thus, when a strongly adhesive material is used, it becomes difficult to peel off the laminate film 82 under vacuum. In order to eliminate this problem of air between the coating film layer and the laminate film, it is possible to use a sheet-like member having a porous structure as the material of the laminate film 82, instead of a film formed by melt film-forming such as polyethylene.

Also, the inorganic film 14 is preferably formed in a thickness of 10 nm or more and 200 nm or less.

According to the method of the presently disclosed subject matter for manufacturing a functional film, the occurrence of defects of an inorganic film such as cracks and deficiencies can be suppressed and a method with high productivity for manufacturing the functional film can be provided. Thus, the moisture permeability of the functional film can be controlled below $1.0 \times 10^{-3}$ g/m²·day.

The coating film 12 preferably is smooth and has high film hardness. The smoothness of the coating film 12 is, in terms of average roughness (Ra value) per about 10 μm square, preferably 10 nm or less, more preferably 2 nm or less.

The film hardness of the coating film 12 is preferably not less than a certain level of hardness. The hardness, as a penetration hardness when measured by a nanoindentation measurement method, is preferably 100 N/mm² or higher, more preferably 200 N/mm² or higher. Further, in terms of pencil hardness (defined by the Japanese Industrial Standards, no. JIS S 6006), the film preferably has hardness of "HB" or higher, more preferably "H" or higher.

In the presently disclosed subject matter, there is no particular limitation on the support B on which the coating film 12 and the inorganic film 14 are formed. As long as formation of the after-mentioned coating film 12 and inorganic film 14 by vacuum film-forming are possible, various base materials (base films) are all usable, including various resin films such as a PET (polyethylene terephthalate) film and various metallic films such as an aluminum sheet, which are used in various functional films including gas barrier films, optical films, and protective films.

In addition, the support B may be one which has various films formed on the surface, such as a protective film and an adhesive film.

An applied film which constitutes the coating film 12 contains a radiation-curable monomer or oligomer as the main component. Specifically, the monomer or oligomer to be used is preferably a monomer or oligomer which includes two or more ethylenic unsaturated double bonds and can undergo addition-polymerization by irradiation of light preferably. Such a monomer or oligomer includes a compound having in a molecule at least one ethylenic unsaturated group which can undergo addition-polymerization and having a boiling point of 100° C. or higher under ordinary pressure. Examples of the monomer or oligomer include monofunctional acrylates or monofunctional methacrylates such as polyethylene glycol mono(meth)acrylate, polypropylene glycol mono(meth)acrylate, and phenoxyethyl (meth)acrylate; polyethylene glycol di(meth)acrylate, polypropylene glycol di(meth)acrylate, trimethylolethane triacrylate, trimethylolpropane tri(meth)acrylate, trimethylolpropane diacrylate, neopentylglycol di(meth)acrylate, pentaerythritol tetra(meth)acrylate, pentaerythritol tri(meth)acrylate, dipentaerythritol hexa(meth)acrylate, dipentaerythritol penta(meth)acrylate, hexanediol di(meth)acrylate, trimethylolpropane tri(acryloyloxypropyl) ether, tri(acryloyloxyethyl) isocyanurate, tri(acryloyloxyethyl) cyanurate, glycerin tri(meth)acrylate; polyfunctional acrylates or polyfunctional methacrylates such as (meth) acrylate of an ethylene oxide or propylene oxide adduct of a polyfunctional alcohol such as trimethylol propane and glycerin.

Further, there may be mentioned polyfunctional acrylates and methacrylates such as urethane acrylates described in Japanese Examined Application Publication No. S48-41708, Japanese Examined Application Publication No. S50-6034, and Japanese Patent Application Laid-Open No. S51-37193; polyester acrylates described in Japanese Patent Application Laid-Open No. S48-64183, Japanese Examined Application Publication No. S49-43191, and Japanese Examined Application Publication No. 552-30490; epoxy acrylates which are reaction products between epoxy resins and (meth)acrylic acid.

Among these, preferable are trimethylolpropane tri(meth)acrylate, pentaerythritol tetra(meth)acrylate, dipentaerythritol hexa(meth)acrylate, and dipentaerythritol penta(meth) acrylate.

Also, in addition to these, there may be mentioned as a preferable material the "polymerizable compound B" described in Japanese Patent Application Laid-Open No. H11-133600.

As a photopolymerization initiator or a photopolymerization initiator system to be used, there may be mentioned a vicinal polyketaldonyl compound disclosed in U.S. Pat. No. 2,367,660, an acyloin ether compound described in U.S. Pat. No. 2,448,828, an aromatic acyloin compound substituted by an α-hydrocarbon as described in U.S. Pat. No. 2,722,512, a polynuclear quinone compound described in U.S. Pat. Nos. 3,046,127 and 2,951,758, a combination of triaryl imidazole dimer and p-aminoketone described in U.S. Pat. No. 3,549,367, a benzothiazole compound and a trihalomethyl-s-triazine compound described in Japanese Examined Application Publication No. 551-48516, a trihalomethyl triazine compound described in U.S. Pat. No. 4,239,850, a trihalomethyloxadiazole compound described in U.S. Pat. No. 4,212,976, and the like. Especially preferable are trihalomethyl-s-triazine, trihalomethyloxadiazole, and triaryl imidazole dimer.

Also, in addition to these, there may be mentioned as a preferable material the "polymerization initiator C" described in Japanese Patent Application Laid-Open No. H11-133600. The amount of the photopolymerization initiator to be used is, based on the solid content of the coating liquid, preferably 0.01 to 20% by mass, more preferably 0.5 to 10% by mass. Photo-irradiation to polymerize a liquid crystalline compound is preferably conducted by using ultraviolet light. The irradiation energy is preferably 20 mJ/cm² to 50 J/cm², more preferably 100 mJ/cm² to 2000 mJ/cm². In order to facilitate photopolymerization reaction, photo-irradiation may be carried out under a heating condition.

Film-forming methods of the coating film 12 include a usual solution coating method, a vacuum film-forming method.

As the solution coating method, there can be mentioned a dip coating method, an air knife coating method, a curtain coating method, a roller coating method, a wire bar coating method, a gravure coating method, a slide coating method, or an extrusion coating method in which a hopper is use as described in U.S. Pat. No. 2,681,294.

Polymerization of acrylates and methacrylates is subject to inhibition by oxygen in air. Therefore, in the presently disclosed subject matter, when they are used as the coating film 12, it is preferable to lower the oxygen concentration or the partial pressure of oxygen at the time of polymerization. When the oxygen concentration at the time of polymerization is lowered by a nitrogen replacement method, the oxygen concentration is preferably 2% or less, more preferably 0.5% or less. When the oxygen partial pressure at the time of polymerization is lowered by an evacuation method, the total pressure is preferably 1000 Pa or less, more preferably 100 Pa or less. In addition, it is especially preferable to carry out ultraviolet light polymerization by irradiating energy of 2 J/cm$^2$ or more under a reduced pressure condition of 100 Pa or less.

In the presently disclosed subject matter, the degree of polymerization of monomers is preferably 80% or more, more preferably 85% or more, further preferably 90% or more. Here, the degree of polymerization means the ratio of polymerizable group which reacted to the total polymerizable groups (for example, an acryloyl group or a methacryloyl group in the case of acrylates or methacrylates) present in the monomer mixture.

When the laminate film (functional film) of the presently disclosed subject matter is used to manufacture a protective film for various devices and instruments such as display devices including an organic EL display and a liquid crystal display, it is sufficient to form a silicon oxide film and the like as the inorganic film 14.

Further, when manufacturing optical films such as an anti reflection film, a light reflection film, and various filters, it is sufficient to form, as the inorganic film 14, a film including a material which has or exhibits the desired optical characteristics.

Above all, especially, the presently disclosed subject matter is best suited for production of a gas barrier film since the coating film 12 has excellent surface smoothness, which enables formation of the inorganic film 14 having a superior gas barrier property.

Also, when laminating, namely when an additional coating film is formed on the inorganic film 14, "tight winding" and "handling damage" may occur in the same way, so that the effect of the presently disclosed subject matter becomes more pronounced.

Heretofore, the method of the presently disclosed subject matter for manufacturing a functional film has been described in detail but the presently disclosed subject matter is not limited to the above-described embodiments. It is a matter of course that various improvements and modifications can be made unless they deviate from the scope of the presently disclosed subject matter.

EXAMPLES

Hereinafter, the presently disclosed subject matter will be described in more detail with reference to specific examples of the presently disclosed subject matter.

A functional film was manufactured using the coating film-forming apparatus 20 and the vacuum film-forming apparatus 22, which are shown in FIG. 2.

The coating film was obtained by dissolving acrylate monomers and a photopolymerization initiator in an organic solvent, and the solution was applied by a die coater, dried, and cured by ultraviolet light curing (hardening-processing). The thickness of the coating film layer was controlled by an amount of the coating liquid fed so that the film thickness in a completely cured (hardening-processed) state became about 1 μm.

Further, in the following Table 1, in the experiments wherein the insert position of a laminate film is designated "immediately after", the laminate film was affixed on the surface of the coating film layer at a position after curing of the coating film and before a touch roller which comes in contact with the coated surface.

Also, in the following Table 1, in the experiments wherein the insert position of a laminate film is designated as "take-up section", the laminate film was affixed on the surface of the coating film layer at a position after the film has passed through all the touch rollers coming in contact with the coated surface.

To affix the laminate film, when the insert position of the laminate film is "immediately after", the laminate film was inserted onto the coated surface after the ultraviolet light is irradiated by the ultraviolet light irradiation instrument. The laminate film was laminated onto the coating film without providing heat using a nip roll but with only the force of an adhesive layer having been applied on the laminate film.

Further, in case the insert position of the laminate film is the "take-up section", the laminate film was affixed while being stretched in the width direction by installing a spiral roller between the laminate film and the nip roller for nipping. In addition, this is for the purpose of preventing the support from being damaged by wrinkles and the like, the wrinkles and the like being caused by deformation of the support due to internal residual air, which arises when the laminate film is not affixed evenly and, upon exposure to vacuum, air between the laminate film and the organic layer is not vacuumed out evenly.

As the support B, there was used a PET base film, which was 1000 mm in width and 100 μM in thickness. The take-up device was controlled so that the take-up tension became constant corresponding to the take-up radius.

Film rolls which have coating film layers formed under various conditions are set in the vacuum film-forming apparatus 22, after, in order to remove air between the laminate film and the coating film layer as much as possible, they were left under atmospheric pressure for 1 hour or longer to allow air escape by self-weight of the film roll. After the vacuum film-forming apparatus 22 was vacuum-evacuated, the laminate film 82 was peeled off either "immediately after" the unwinder 56 (before the support passes through the pass roller 68 which contacts the coating film side of the support) or "immediately before" the film-forming drum 62 (after the support passed the pass roller 68 which contacts the coating film side of the support), and then the inorganic film 14 was formed. In addition, when the laminate film was peeled off, in order to suppress increase in adhesion force under vacuum and, thus, movement of the film roll at the laminate film peel-off/take-up section was controlled with the torque being regulated.

As for the inorganic film, aluminum was employed as the target and an alumina film was formed by reactive sputtering to obtain the functional film 10.

The thus prepared functional film 10 was evaluated for performance by using water vapor transmission, according to the following criteria.

[Evaluation Criteria of Performance (Moisture Permeability)]

D: $1.0 \times 10^{-3}$ g/m$^2$·day or more

C: $2.0 \times 10^{-4}$ g/m$^2$·day or more but less than $1.0 \times 10^{-3}$ g/m$^2$·day B: $1.0 \times 10^{-4}$ g/m$^2$·day or more but less than $2.0 \times 10^{-4}$ g/m$^2$·day A: Less than $1.0 \times 10^{-4}$ g/m$^2$·day

TABLE 1

| Experiment | Laminate film | Laminate film thickness (μm) | Laminating film insert position | Laminate film peel-off position | Inorganic film thickness (nm) | Moisture permeability (g/m² · day) | Performance evaluation |
|---|---|---|---|---|---|---|---|
| 1 | Absent | — | — | — | 50 | $1.2 \times 10^{-3}$ | D |
| 2 | Present | 60 | Immediately after | Immediately after | 50 | $1.7 \times 10^{-4}$ | B |
| 3 | Present | 60 | Immediately after | Immediately before | 50 | $8.0 \times 10^{-5}$ | A |
| 4 | Present | 60 | Take-up section | Immediately after | 50 | $1.9 \times 10^{-4}$ | B |
| 5 | Present | 60 | Take-up section | Immediately before | 50 | $1.3 \times 10^{-4}$ | B |
| 6 | Present | 5 | Immediately after | Immediately before | 50 | $4.3 \times 10^{-4}$ | C |
| 7 | Present | 10 | Immediately after | Immediately before | 50 | $1.0 \times 10^{-4}$ | B |
| 8 | Present | 200 | Immediately after | Immediately before | 50 | $7.0 \times 10^{-5}$ | A |
| 9 | Present | 300 | Immediately after | Immediately before | 50 | $2.5 \times 10^{-4}$ | C |
| 10 | Present | 60 | Immediately after | Immediately before | 10 | $9.6 \times 10^{-4}$ | C |
| 11 | Present | 60 | Immediately after | Immediately before | 20 | $1.3 \times 10^{-4}$ | B |
| 12 | Present | 60 | Immediately after | Immediately before | 200 | $5.1 \times 10^{-5}$ | A |

Evaluation of the moisture permeability becomes A, B, or C in Experiments 2 to 12, which includes a step for feeding a support continuously from the film roll, forming a coating film on the support, providing a laminate film on the surface of the coating film, and taking up the support as a film roll; and a step for loading the film roll made in the aforementioned step in a vacuum film-forming apparatus, feeding the support provided with the laminate film continuously from the film roll, peeling off the laminate film, forming an inorganic film on the coating film on the support, and taking up the support as a film roll. Thus, it can be seen that, according to the presently disclosed subject matter, the occurrence of defects of the inorganic film such as cracks and deficiencies can be suppressed.

Also, it became clear that it is more effective to insert the laminate film after formation of the coating film and before a touch roll comes into contact with the coating film, and to peel off the laminate film before formation of the inorganic film, or immediately before formation of the inorganic film after the support passed through all the pass rollers which come into contact with the coating film side of the support.

Further, it became clear that the inorganic film is preferably formed in a thickness of 10 nm to 200 nm and the thickness of the laminate film is preferably 10 μm to 300 μm.

What is claimed is:

1. A method for manufacturing a functional film, comprising steps of:
   feeding a support continuously from a first film roll, forming a coating film on the support, providing a laminate film on a surface of the coating film under atmospheric pressure, and taking up the support to a second film roll; and
   loading the second film roll made by the aforementioned step in a vacuum film-forming apparatus, feeding the support provided with the laminate film continuously from the second film roll, peeling off the laminate film, forming an inorganic film on the coating film on the support, and taking up the support to a third film roll, wherein
   an adhesive material having a peel force of 1 N/m or more and 5 N/m or less against the coating film is applied on the laminate film, wherein
   the laminate film has a porous structure, and
   the laminate film is provided after curing of the coating film and before a pass roller coming in contact with the coating film side of the support, and the laminate film is peeled off before formation of the inorganic film and after passing through all pass rollers coming in contact with the coating film side of the support.

2. The method for manufacturing a functional film according to claim 1, wherein thickness of the laminate film is 10 μm or more and 300 μm or less.

3. The method for manufacturing a functional film according to claim 1, wherein the thickness of the inorganic film is 10 nm or more and 200 nm or less.

4. The method for manufacturing a functional film according to claim 1, wherein the moisture permeability of the functional film is less than $1.0 \times 10^{-3}$ g/m²·day.

5. The method for manufacturing a functional film according to claim 1, wherein the coating film is formed from a material comprising a radiation-curable monomer or oligomer.

6. A method for manufacturing a functional film according to claim 1, wherein the laminate film is a sheet-like member having a porous structure.

7. The method for manufacturing a functional film according to claim 1, wherein the coating film has a hardness of "HB" or higher in terms of pencil hardness (defined by the Japanese Industrial Standards, No. JIS S 6006), and the coating film has an average surface roughness of 10 nm or less per 10 μm square.

* * * * *